United States Patent
Ro et al.

(10) Patent No.: US 10,345,669 B2
(45) Date of Patent: Jul. 9, 2019

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Sungin Ro, Hwaseong-si (KR); Sungjin Kim, Seongnam-si (KR); Seunghyun Park, Seoul (KR); Ocksoo Son, Seoul (KR); Junho Song, Seongnam-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 184 days.

(21) Appl. No.: 15/252,268

(22) Filed: Aug. 31, 2016

(65) Prior Publication Data
US 2017/0123248 A1     May 4, 2017

(30) Foreign Application Priority Data
Nov. 4, 2015   (KR) .......................... 10-2015-0154552

(51) Int. Cl.
| | |
|---|---|
| *G02F 1/1333* | (2006.01) |
| *G02F 1/1335* | (2006.01) |
| *G02F 1/1362* | (2006.01) |
| *H01L 29/786* | (2006.01) |
| *H01L 27/12* | (2006.01) |
| *G02F 1/1368* | (2006.01) |

(52) U.S. Cl.
CPC ...... *G02F 1/1368* (2013.01); *G02F 1/133345* (2013.01); *G02F 1/133512* (2013.01); *G02F 1/133514* (2013.01); *G02F 1/133553* (2013.01); *H01L 27/124* (2013.01); *H01L 27/1222* (2013.01); *H01L 27/1262* (2013.01); *H01L 29/78618* (2013.01); *H01L 29/78633* (2013.01); *H01L 29/78669* (2013.01); *G02F 1/136209* (2013.01); *G02F 2001/136222* (2013.01); *G02F 2201/123* (2013.01)

(58) Field of Classification Search
CPC ............... G02F 2001/136222; G02F 1/133553
See application file for complete search history.

(56) References Cited

U.S. PATENT DOCUMENTS

| | | | |
|---|---|---|---|
| 2002/0113927 A1* | 8/2002 | Ha ................... | G02F 1/133553 349/113 |
| 2007/0126969 A1* | 6/2007 | Kimura ............ | G02F 1/134363 349/141 |

(Continued)

FOREIGN PATENT DOCUMENTS

| | | | |
|---|---|---|---|
| KR | 20030057207 A | * | 7/2003 |
| KR | 10-2004-0085789 A | | 10/2004 |

(Continued)

*Primary Examiner* — Alexander P Gross
(74) *Attorney, Agent, or Firm* — Lee & Morse, P.C.

(57) ABSTRACT

A display device includes a first substrate, a thin film transistor on the first substrate, a passivation layer on the thin film transistor, a reflective layer on the passivation layer, a color filter on the reflective layer, the reflective layer having a substantially same shape as that of the color filter in a plan view, a first insulating layer on the color filter, a pixel electrode on the first insulating layer, a second substrate opposing the first substrate, and a liquid crystal layer between the first substrate and the second substrate.

8 Claims, 10 Drawing Sheets

(56) References Cited

U.S. PATENT DOCUMENTS

| | | |
|---|---|---|
| 2014/0002777 A1 | 1/2014 | Kim et al. |
| 2014/0159020 A1* | 6/2014 | Song ................... H01L 27/3244 257/40 |
| 2014/0291667 A1* | 10/2014 | Nakada ................ H01L 27/124 257/43 |
| 2014/0313463 A1* | 10/2014 | Jang ................... G02F 1/136209 349/106 |
| 2015/0108471 A1 | 4/2015 | Nakada et al. |

FOREIGN PATENT DOCUMENTS

| | | |
|---|---|---|
| KR | 10-2014-0004289 A | 1/2014 |
| KR | 10-2015-0045365 A | 4/2015 |

* cited by examiner

DISPLAY DEVICE AND METHOD OF MANUFACTURING THE SAME

CROSS-REFERENCE TO RELATED APPLICATION

Korean Patent Application No. 10-2015-0154552, filed on Nov. 4, 2015, in the Korean Intellectual Property Office, and entitled: "Display Device and Method of Manufacturing the Same," is incorporated by reference herein in its entirety.

BACKGROUND

1. Field

Embodiments relate to a display device and a method of manufacturing the display device.

2. Description of the Related Art

Display devices include liquid crystal display ("LCD") devices, organic light emitting diode ("OLED") display devices, plasma display panel ("PDP") devices, electrophoretic display ("EPD") devices, and the like. In an LCD panel, liquid crystal molecules of a liquid crystal layer are realigned by voltages that are applied to two electrodes, thereby adjusting the amount of light being transmitted through the LCD panel and displaying an image on the LCD device.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments are directed to a display device, including a first substrate, a thin film transistor on the first substrate, a passivation layer on the thin film transistor, a reflective layer on the passivation layer, a color filter on the reflective layer, the reflective layer having a substantially same shape as that of the color filter in a plan view, a first insulating layer on the color filter, a pixel electrode on the first insulating layer, a second substrate opposing the first substrate, and a liquid crystal layer between the first substrate and the second substrate.

The display device may further include a second insulating layer between the thin film transistor and the reflective layer.

The color filter and the reflective layer may not overlap the thin film transistor.

The display device may further include a light blocking member on the first insulating layer, the light blocking member overlapping the thin film transistor.

The color filter and the reflective layer may overlap a portion of the thin film transistor.

The display device may further include a light blocking member on the first insulating layer, the light blocking member overlapping the thin film transistor.

The reflective layer may include at least one of aluminum, an aluminum alloy, silver, and silver-molybdenum.

Embodiments are also directed to a method of manufacturing a display device, the method including disposing a thin film transistor on a first substrate, disposing a reflective layer material on the first substrate, disposing a color filter on the reflective layer material, patterning the reflective layer material using the color filter as a mask to thereby provide a reflective layer, disposing a first insulating layer on the color filter, and disposing a pixel electrode on the first insulating layer.

The patterning of the reflective layer material may include wet etching.

The disposing of the color filter and the providing of the reflective layer may include defining a pattern of the color filter and defining a pattern of the reflective layer to overlap the thin film transistor.

The disposing of the color filter and the providing of the reflective layer may include defining a pattern of the color filter and defining a pattern of the reflective layer to overlap a portion of the thin film transistor.

The method may further include disposing a light blocking member on the first insulating layer to overlap the thin film transistor.

The disposing of the color filter and the disposing of the reflective layer may include defining a pattern of the color filter and defining a pattern of the reflective layer not to overlap the thin film transistor.

The method may further include disposing a light blocking member on the first insulating layer to overlap the thin film transistor.

The method may further include disposing a second insulating layer between the thin film transistor and the reflective layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
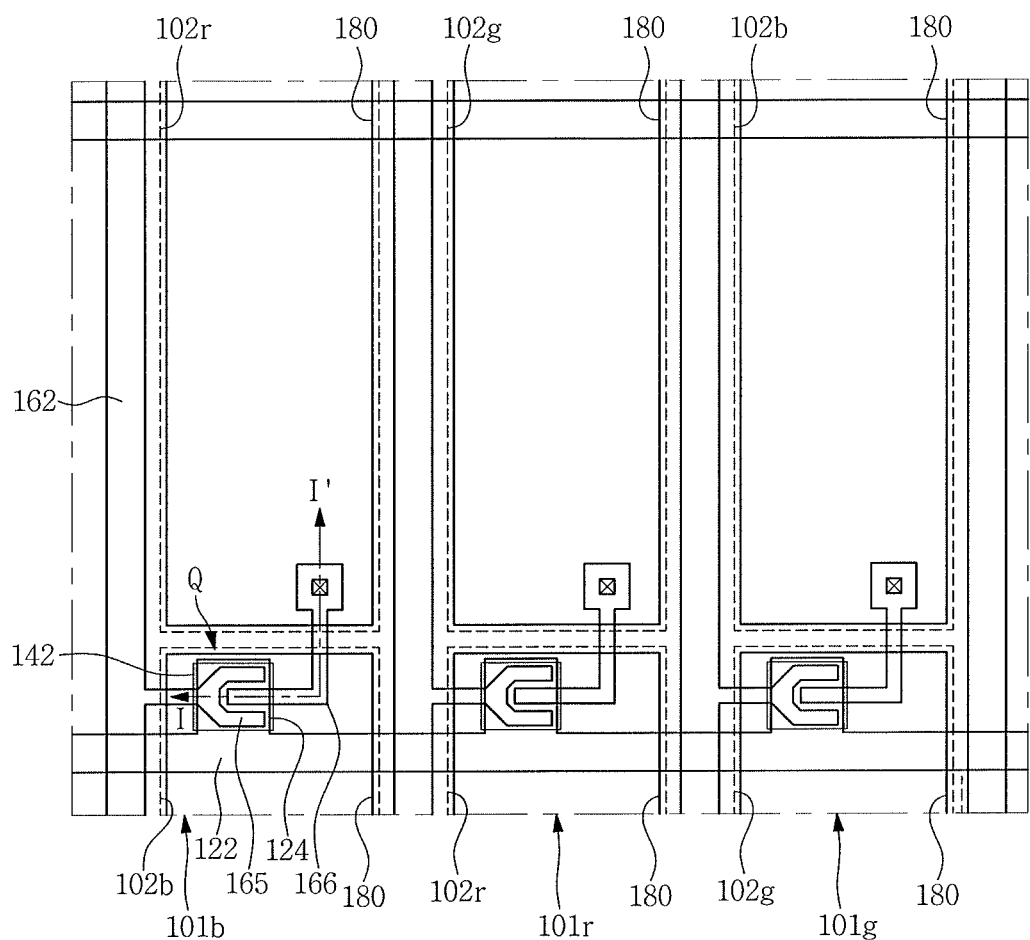
FIG. 1 illustrates a schematic plan view of an example embodiment of a display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. The embodiments may be combined to form additional embodiments.

In the drawing figures, the dimensions of layers and regions may be exaggerated for clarity of illustration. It will also be understood that when an element (e.g., a layer) is referred to as being "on" another element or substrate, it can be directly on the other element or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

Hereinafter, example embodiments of a display device will be explained with respect to a liquid crystal display ("LCD") device, but features may also be applied to, for example, an organic light emitting diode ("OLED") display device.

In one or more example embodiments, the display device has a color filter on array ("COA") structure in which a thin film transistor and a color filter are disposed on the same substrate.

In such example embodiments, a light blocking member for covering a data line to block light may be omitted in the display device. Instead, the light may be blocked by liquid crystal molecules that are aligned by an electric field applied to an electrode wiring oriented substantially parallel to the data line, such that the data line may be invisible.

Figure 2:
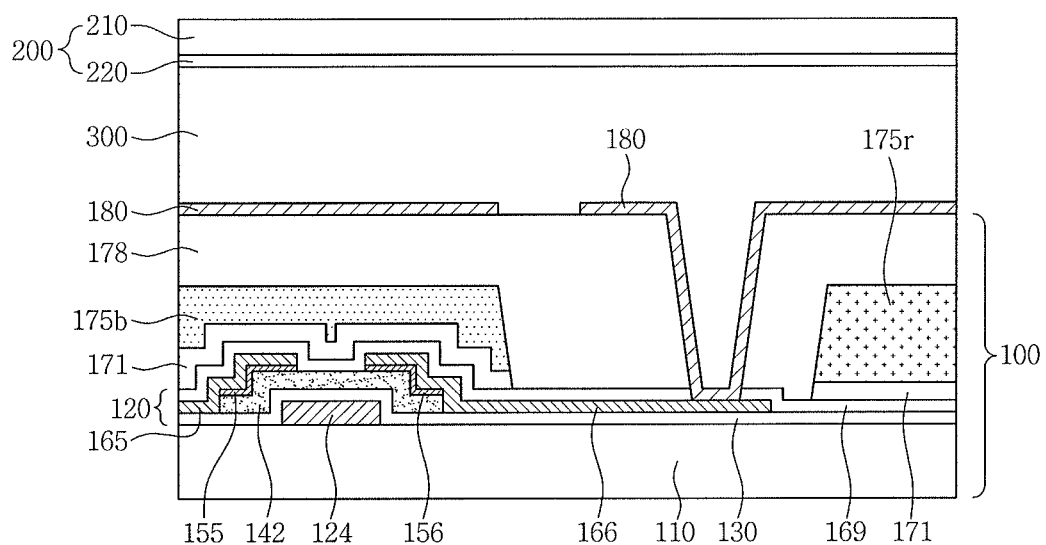
FIG. 2 illustrates a cross-sectional view taken along line I-I' of FIG. 1 according to an example embodiment.

FIG. 1 illustrates a schematic plan view of an example embodiment of a display device. FIG. 2 illustrates a cross-sectional view taken along line I-I' of FIG. 1 according to an example embodiment.

Referring to FIGS. 1 and 2, in an example embodiment, the display device includes a first panel 100, a second panel 200 opposing the first panel 100, and a liquid crystal layer 300 between the first panel 100 and the second panel 200.

The first panel 100 includes a first substrate 110 including a plurality of pixel units 101, a layer structure 120 disposed on the first substrate 110 and including a thin film transistor Q, a reflective layer 171 disposed on the layer structure 120, a plurality of color filters 175 disposed on the reflective layer 171 and including red, green, and blue color filters 175r, 175g, and 175b, a first insulating layer 178 disposed on the plurality of color filters 175, and a pixel electrode 180 disposed on the first insulating layer 178.

The plurality of pixel units 101 include red, green, and blue pixel units 101r, 101g, and 101b arranged substantially in a matrix form.

The red, green, and blue pixel units 101r, 101g, and 101b include red, green, and blue pixel areas 102r, 102g, and 102b in which the pixel electrodes 180 are disposed, respectively.

As used herein, the red, green, and blue pixel areas 102r, 102g, and 102b are collectively referred to as a pixel area 102, for convenience of description.

The pixel area 102 is an area in which the transmittance of ambient light is controlled based on the alignment of liquid crystal molecules of the liquid crystal layer 300.

The first substrate 110 may be an insulating substrate including a transparent material such as glass (e.g., soda-lime glass or borosilicate glass) or plastic.

Gate wirings 122 and 124 are disposed on the first substrate 110 to transmit a gate signal. The gate wirings 122 and 124 include a gate line 122 extending in a direction, for example, a transverse direction, and a gate electrode 124 defined by a protruding portion of the gate line 122 to form a protrusion shape. The gate electrode 124, along with a source electrode 165 and a drain electrode 166, which are described below in greater detail, may collectively define a three-terminal structure of the thin film transistor Q.

A storage wiring may further be disposed on the first substrate 110 to define a storage capacitor, along with the pixel electrode 180. For example, the storage wiring may be provided simultaneously with the gate wirings 122 and 124. In such an example, the storage wiring may be disposed on the same layer as the layer on which the gate wirings 122 and 124 are disposed, and may include the same material as that included in the gate wirings 122 and 124.

In an example embodiment, the gate wirings 122 and 124 may include an aluminum (Al)-based metal, e.g., Al or an Al alloy, a silver (Ag)-based metal, e.g., Ag or an Ag alloy, a copper (Cu)-based metal, e.g., Cu or a Cu alloy, a molybdenum (Mo)-based metal, e.g., Mo or a Mo alloy, chromium (Cr), titanium (Ti), tantalum (Ta), and/or the like.

In an example embodiment, the gate wirings 122 and 124 may have a multilayer structure including two conductive layers (not illustrated) having different physical properties from one another.

One of the two conductive layers may include a metal, e.g., an Al-based metal, an Ag-based metal, or a Cu-based metal, which has relatively low resistivity, to reduce a signal delay or a voltage drop of the gate wirings 122 and 124.

The other of the two conductive layers may include a material, e.g., a Mo-based metal, Cr, Ti, or Ta, which has a relatively high contact property with another material, e.g., indium-tin oxide ("ITO") and indium-zinc oxide ("IZO").

The gate wirings 122 and 124 may include a suitable metal and conductor. For example, combinations of layers of the multilayer structure may include a Cr lower layer and an Al upper layer, an Al lower layer and a Mo upper layer, and a Ti lower layer and a Cu upper layer.

A gate insulating layer 130 is disposed on the first substrate 110 and the gate wirings 122 and 124. In an example embodiment, the gate insulating layer 130 may include silicon oxide ($SiO_x$) or silicon nitride ($SiN_x$), for example. In an example embodiment, the gate insulating layer 130 may include aluminum oxide, titanium oxide, tantalum oxide, or zirconium oxide, for example.

A semiconductor layer 142 is disposed on the gate insulating layer 130 to form a channel of the thin film transistor Q. The semiconductor layer 142 overlaps at least a portion of the gate electrode 124. In an example embodiment, the semiconductor layer 142 may include amorphous silicon (also referred to as "a-Si"), or an oxide semiconductor including at least one of gallium (Ga), indium (In), tin (Sn), and zinc (Zn).

Ohmic contact layers 155 and 156 are disposed on the semiconductor layer 142. The ohmic contact layers 155 and 156 may increase a contact property between the source electrode 165 and/or the drain electrode 166 and the semiconductor layer 142.

In an example embodiment, the ohmic contact layers 155 and 156 may include amorphous silicon doped with n-type impurities at high concentration (also referred to as "n+a-Si"). In an example embodiment in which the contact property between the source electrode 165 and/or the drain electrode 166 and the semiconductor layer 142 is sufficiently secured, the ohmic contact layers 155 and 156 may be omitted.

Data wirings 162, 165, and 166 are disposed on the ohmic contact layers 155 and 156 and the gate insulating layer 130. The data wirings 162, 165, and 166 include a data line 162, the source electrode 165, and the drain electrode 166. The data line 162 extends in a direction, for example, a longitudinal direction, intersecting the gate line 122 to define, along with the gate line 122, the pixel unit 101. The source electrode 165 branches out from the data line 162 to extend onto the semiconductor layer 142. The drain electrode 166 is spaced apart from the source electrode 165, and is disposed on the semiconductor layer 142 to be opposite to the source electrode 165 with respect to the gate electrode 124 or the channel of the thin film transistor Q. In an example embodiment, the drain electrode 166 may extend from an upper portion of the semiconductor layer 142 to a lower portion of the pixel electrode 180.

A passivation layer 169 is disposed over substantially the entire surface of a structure that includes the data wirings 162, 165, and 166. In an example embodiment, the passivation layer 169 may have a monolayer structure or a multilayer structure including, for example, silicon oxide, silicon nitride, a photosensitive organic material, or a low dielectric constant (low-k) insulating material, e.g., a-Si:C:O or a-Si:O:F.

The structure of the thin film transistor Q described hereinabove with reference to FIGS. 1 and 2 is only given by way of example, and the layer structure 120 including the thin film transistor Q may be modified in any suitable manner. In an example embodiment, the structure of the thin film transistor Q is described as a bottom-gate structure, but the structure of the thin film transistor Q may be a top-gate structure.

The reflective layer 171 is disposed on the passivation layer 169, and has substantially the same shape, in a plan view, as that of the color filter 175, which is described below in greater detail.

In an example embodiment, an undercut may be defined at an end portion of the reflective layer 171.

The reflective layer 171 may include a suitable material that reflects an ambient light source. The reflective layer 171 may include a conductive material, e.g., a metal, and examples of such a metal may include Al, an Al alloy, Ag, and/or Ag—Mo ("AMO").

The plurality of color filters 175 including the red, green, and blue color filters 175r, 175g, and 175b are disposed on the reflective layer 171.

The red, green, and blue color filters 175r, 175g, and 175b are disposed corresponding to the red, green, and blue pixel areas 102r, 102g, and 102b, respectively.

In an example embodiment, the red, green, and blue color filters 175r, 175g, and 175b may be disposed in an island-shaped manner, corresponding to the red, green, and blue pixel areas 102r, 102g, and 102b, respectively. In the present example embodiment, the plurality of color filters 175 may be spaced apart from one another in a transverse or longitudinal direction. In another example embodiment, adjacent edges of adjacent ones of the color filters 175 may overlap one another.

In an example embodiment, the pixel area 102 is described as including three pixel areas, for example, the red pixel area 102r, the green pixel area 102g, and the blue pixel area 102b, but the pixel area 102 may include four or more pixel areas which further include a white pixel area, for example.

The first insulating layer 178 may be disposed on the plurality of color filters 175. In an example embodiment, the first insulating layer 178 may have a monolayer structure or a multilayer structure including, for example, silicon oxide, silicon nitride, a photosensitive organic material, or a low dielectric constant (low-k) insulating material, e.g., a-Si:C:O or a-Si:O:F.

A first contact hole through which a portion of the thin film transistor Q is exposed may be defined through the first insulating layer 178 and the passivation layer 169. For example, an end portion of the drain electrode 166, below the pixel electrode 180, may be exposed by the first contact hole.

The pixel electrode 180 is disposed on the first insulating layer 178 to be electrically connected to the drain electrode 166 through the first contact hole. The pixel electrode 180 may include a transparent conductor, e.g., ITO or IZO. As previously described, the pixel electrode 180 is disposed in the pixel area 102, and may be connected to the thin film transistor Q through the first contact hole.

A lower alignment layer may be disposed on the pixel electrode 180. In an example embodiment, the lower alignment layer may be a homeotropic alignment layer, or may include a photosensitive material, for example.

In an example embodiment, for example, the lower alignment layer may include one of polyamic acid, polysiloxane, and polyimide.

The second panel 200 includes a second substrate 210 and a common electrode 220. The second substrate 210 may be an insulating substrate including a transparent material, e.g., glass or plastic. The common electrode 220 may include a transparent conductor, e.g., ITO or IZO.

The second panel 200 may further include an upper alignment layer. The upper alignment layer may be disposed on the common electrode 220. In an example embodiment, the upper alignment layer and the lower alignment layer may include the same material as one another.

When surfaces of the first substrate 110 and the second substrate 210 opposing one another are defined as upper surfaces, e.g., inner surfaces, of the corresponding substrates, respectively, and surfaces of the first substrate 110 and the second substrate 210 disposed opposite to the upper surfaces thereof are defined as lower surfaces, e.g., outer surfaces, of the corresponding substrates, respectively, an upper polarizer may further be disposed on the lower surface of the first substrate 110 and a lower polarizer may further be disposed on the lower surface of the second substrate 210.

In an example embodiment, the liquid crystal layer 300 may include nematic liquid crystal materials having positive dielectric anisotropy. In the present example embodiment, the liquid crystal molecules of the liquid crystal layer 300 may have a structure in which a major axis of the liquid crystal molecules is oriented substantially parallel to one of the first panel 100 and the second panel 200 and the major axis is twisted into a spiral shape at an angle of 90 degrees from a rubbing direction of the alignment layer of the first panel 100 to the second panel 200. In another example embodiment, the liquid crystal layer 300 may include homeotropic liquid crystal materials, in lieu of the nematic liquid crystal materials.

Figure 3:
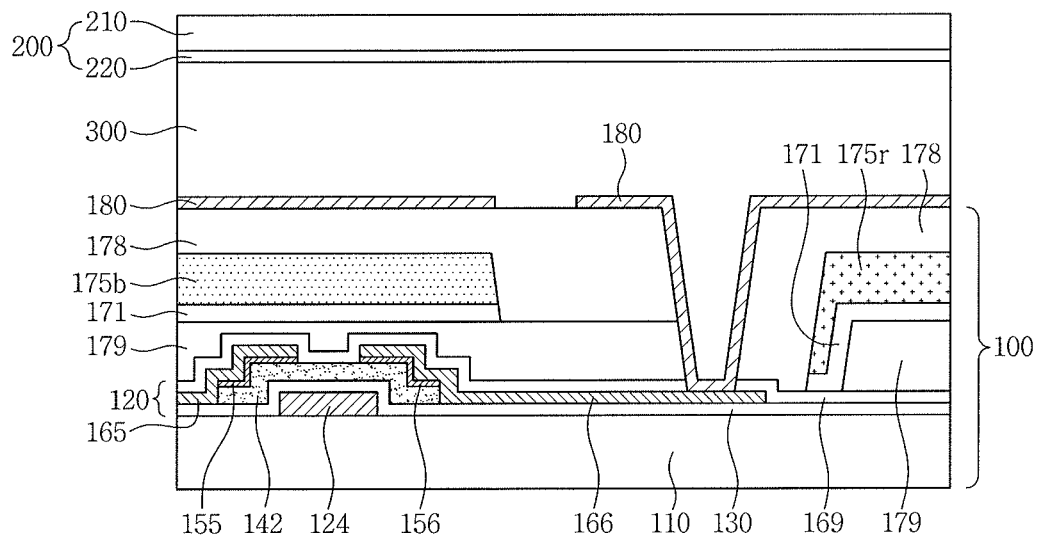
FIG. 3 illustrates a cross-sectional view taken along line I-I' of FIG. 1 according to another example embodiment.

FIG. 3 illustrates a schematic cross-sectional view taken along line I-I' of FIG. 1 according to another example embodiment. A repetitive description of the display device which has been provided in the previous example embodiment will be omitted herein for convenience of description.

Referring to FIG. 3, in an example embodiment, the display device includes a first panel 100, a second panel 200 opposing the first panel 100, and a liquid crystal layer 300 disposed between the first panel 100 and the second panel 200.

The first panel 100 includes a first substrate 110 including a plurality of pixel units 101, a layer structure 120 disposed on the first substrate 110 and including a thin film transistor Q, a plurality of color filters 175 disposed on the layer structure 120 and including red, green, and blue color filters 175r, 175g, and 175b, a first insulating layer 178 disposed on the plurality of color filters 175, and a pixel electrode 180 disposed on the first insulating layer 178.

The plurality of pixel units 101 may include red, green, and blue pixel units 101r, 101g, and 101b arranged substantially in a matrix form.

A second insulating layer 179 is disposed between a passivation layer 169 and a reflective layer 171.

The second insulating layer 179 may have a monolayer structure or a multilayer structure including, for example, silicon oxide, silicon nitride, a photosensitive organic material, or a low dielectric constant (low-k) insulating material, e.g., a-Si:C:O or a-Si:O:F.

A second contact hole through which a portion of the thin film transistor Q is exposed may be defined through the second insulating layer 179. For example, an end portion of a drain electrode 166, below the pixel electrode 180, may be exposed through the second contact hole.

Figure 4:
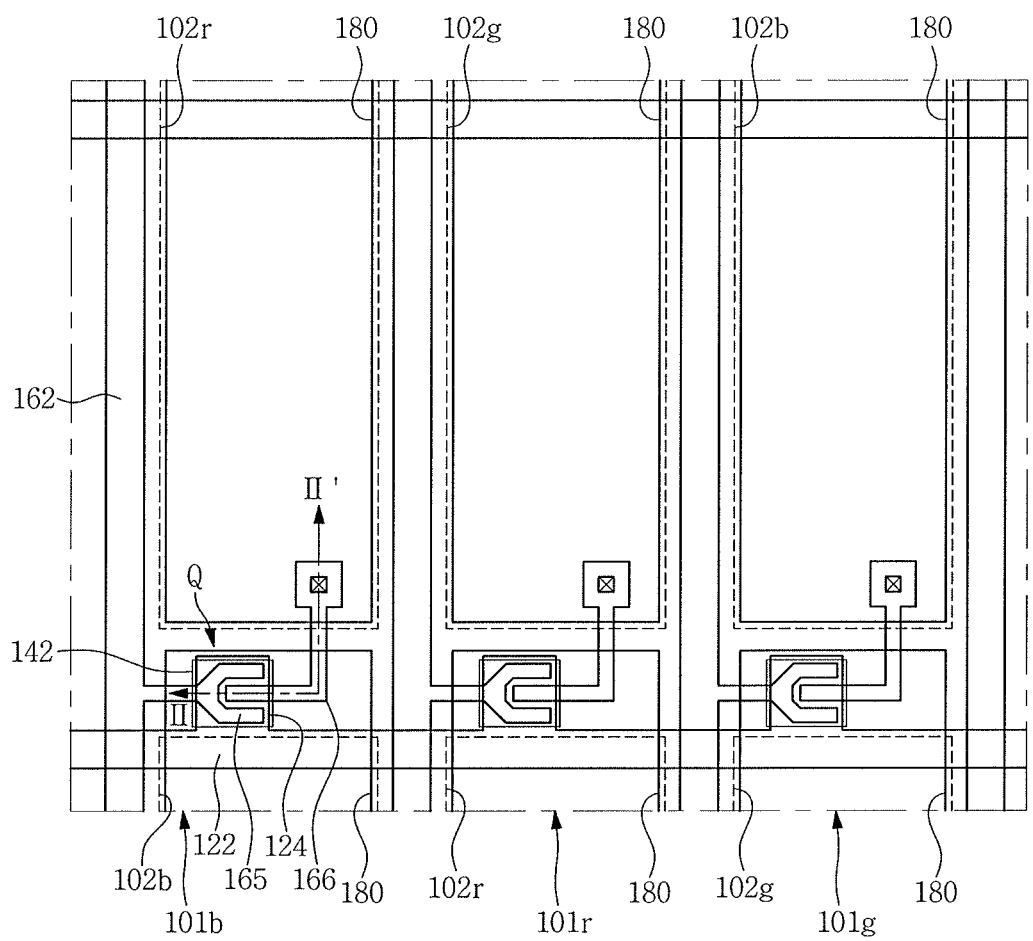
FIG. 4 illustrates a schematic plan view of another example embodiment of a display device.
Figure 5:
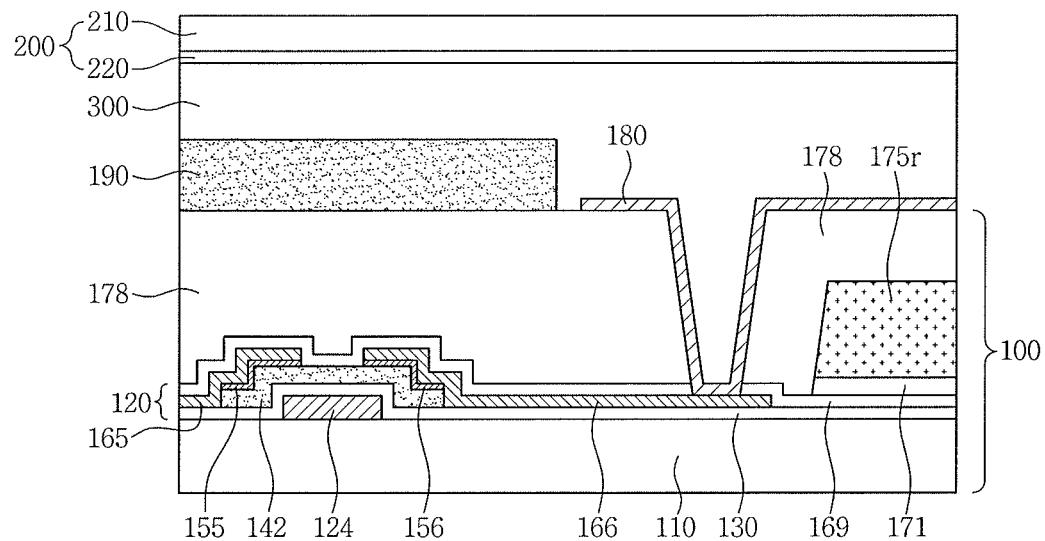
FIGS. 5 and 6 illustrate cross-sectional views taken along line II-II' of FIG. 4.
Figure 6:
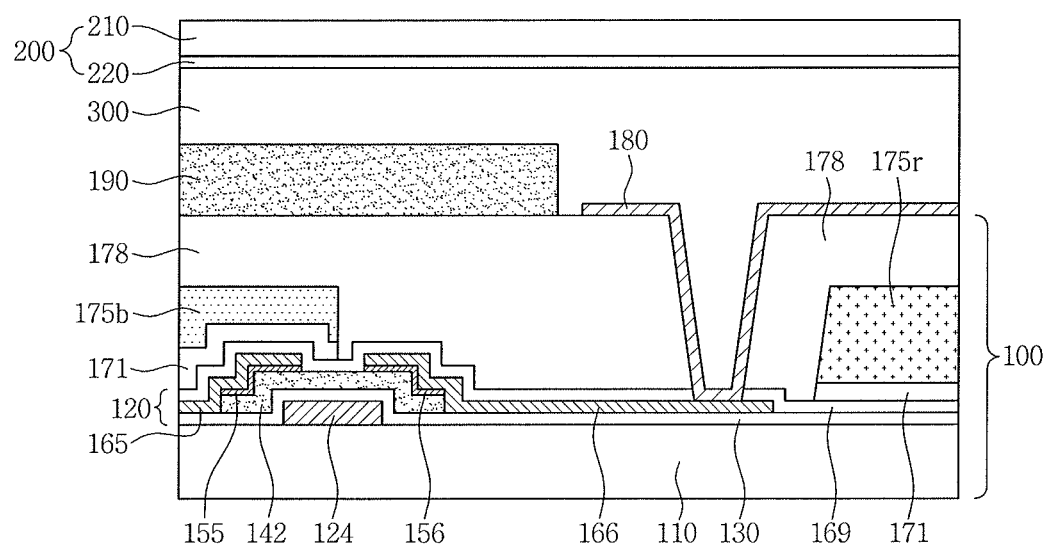

FIG. 4 illustrates a schematic plan view of another alternative example embodiment of a display device. FIGS. 5 and 6 illustrate cross-sectional views taken along line of FIG. 4. A repetitive description of the display device which has been provided in the previous example embodiment will be omitted herein for convenience of description.

Referring to FIGS. 4, 5, and 6, the display device according to another alternative example embodiment includes a first panel 100, a second panel 200 opposing the first panel 100, and a liquid crystal layer 300 disposed between the first panel 100 and the second panel 200.

Referring to FIG. 5, in an example embodiment, a reflective layer 171 and a plurality of color filters 175 are disposed on a passivation layer 169. In the present example embodiment, the reflective layer 171 and the plurality of color filters 175 do not overlap a thin film transistor Q.

A light blocking member 190 is disposed on a first insulating layer 178, and overlaps the thin film transistor Q. Accordingly, the light blocking member 190 may effectively prevent ambient light from being irradiated to the thin film transistor Q.

Referring to FIG. 6, in an example embodiment, a reflective layer 171 and a plurality of color filters 175 are disposed on a passivation layer 169. In the present example embodiment, the reflective layer 171 and the plurality of color filters 175 overlap a portion of a thin film transistor Q.

A light blocking member 190 is disposed on a first insulating layer 178, and overlaps the thin film transistor Q. Accordingly, the light blocking member 190 may effectively prevent ambient light from being irradiated to the thin film transistor Q.

FIGS. 7A, 7B, 7C, 7D, and 7E illustrate cross-sectional views of an example embodiment of a method of manufacturing the display device.

Figure 7A:
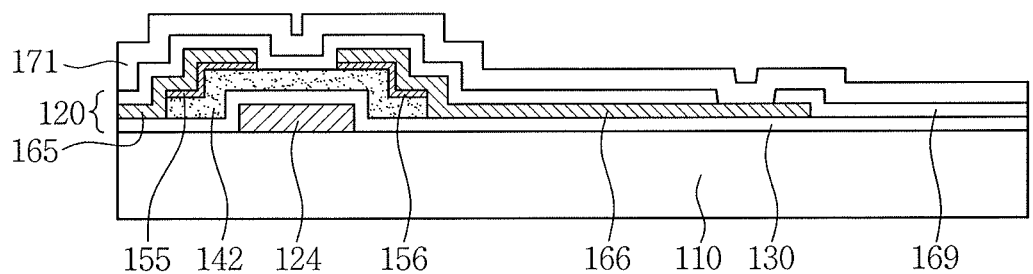
FIGS. 7A, 7B, 7C, 7D, and 7E illustrate cross-sectional views of an example embodiment of a method of manufacturing a display device.

Referring to FIG. 7A, a reflective layer material 170 is disposed on the first substrate 110 on which the thin film transistor Q is disposed. The reflective layer material 170 may include any suitable material that reflects an ambient light source, and may include a metal, for example.

Figure 7B:
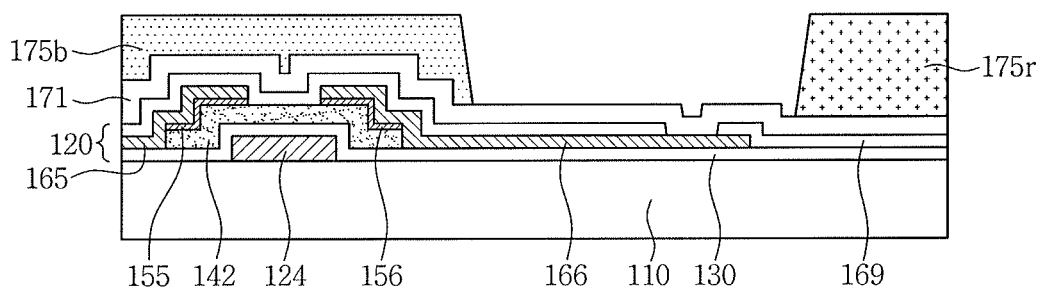

Referring to FIG. 7B, in an example embodiment, the red, green, and blue color filters 175r, 175g, and 175b are disposed on the reflective layer material 170 corresponding to the red, green, and blue pixel areas 102r, 102g, and 102b, respectively, thereby defining respective patterns of the color filters 175 corresponding to respective ones of the pixel areas 102.

The color filter 175 including the red, green, and blue color filters 175r, 175g, and 175b may be provided by a photolithography process or an inkjet process, in addition to, or instead of, a coating process using a mask.

The color filter 175 may have a thickness in a range of, for example, about 2 micrometers (μm) to about 4 μm.

In the present example embodiment, the pattern of the color filter 175 may be defined to overlap a portion of the thin film transistor Q or not to overlap the thin film transistor Q.

Figure 7C:
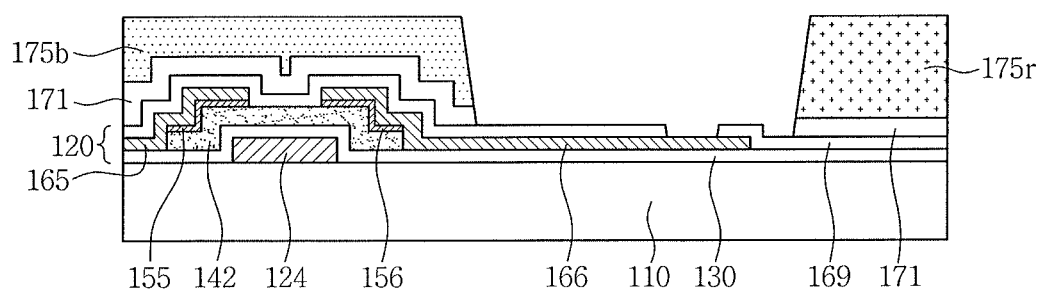

Referring to FIG. 7C, the reflective layer material 170 is patterned using the color filter 175 as a mask. In an example embodiment, the reflective layer material 170 is wet-etched on the first substrate 110, using an etchant including a ferric iron ($Fe^{3+}$) salt compound, nitric acid, acetic acid, a corrosion inhibitor, and water, or an etchant including nitric acid, phosphoric acid, acetic acid, an auxiliary oxide solubilizer, a fluorocarbon surfactant, and water. As a result, a portion of the reflective layer material 170 that is exposed externally of the color filter 175 is etched away and a portion of the reflective layer material 170 that is disposed below the color filter 175 remains, thereby defining a pattern of the reflective layer 171.

The pattern of the reflective layer 171 may be substantially the same as the pattern of the color filter 175. Since the reflective layer material 170 is patterned (e.g., etched) using the color filter 175 as a mask, the pattern of the reflective layer 171 may be defined to overlap a portion of the thin film transistor Q or not to overlap the thin film transistor Q, in a manner similar to that of the pattern of the color filter 175.

In an example embodiment, the etching process includes a wet etching process, for example, but the etching process may include a dry etching process.

In the present example embodiment, the number of masks used to define the pattern of the reflective layer 171 may be relatively reduced.

Figure 7D:
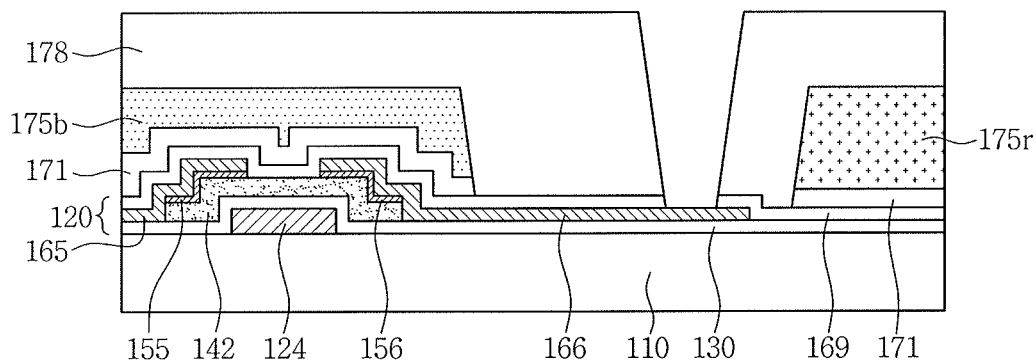

Referring to FIG. 7D, the first insulating layer 178 is disposed on the color filter 175. In an example embodiment, for example, the first insulating layer 178 may include silicon oxide or silicon nitride, and may have a thickness in a range of about 3,000 angstroms (Å) to about 3,500 Å. In the present example embodiment, the first contact hole through which the thin film transistor Q is exposed may be defined through the first insulating layer 178.

Figure 7E:
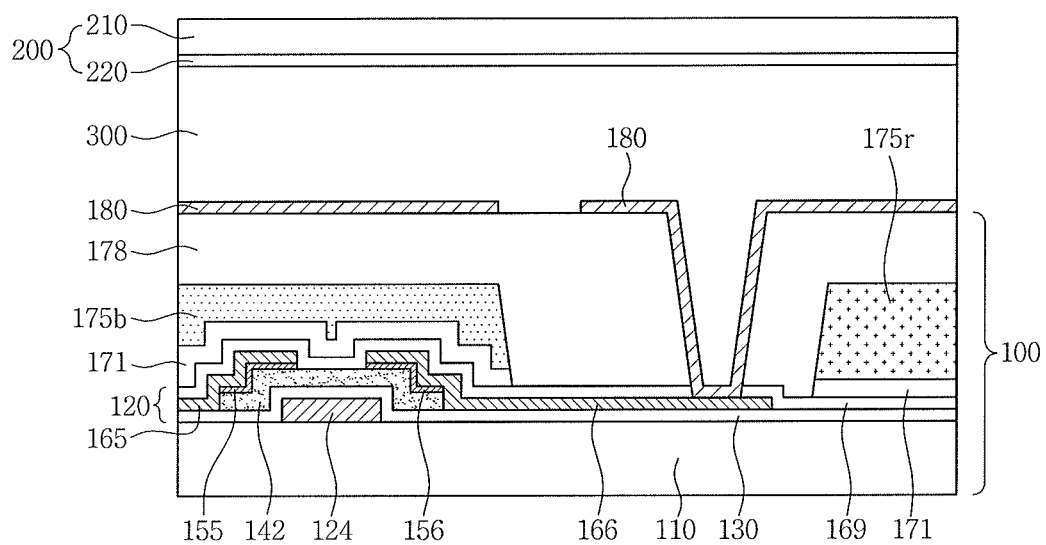

Referring to FIG. 7E, in an example embodiment, the pixel electrode 180 electrically connected to the thin film transistor Q, the liquid crystal layer 300, the common electrode 220, and the second substrate 210 are disposed on the first insulating layer 178. In the present example embodiment, the light blocking member 190 may be disposed on the first insulating layer 178.

Figure 8:
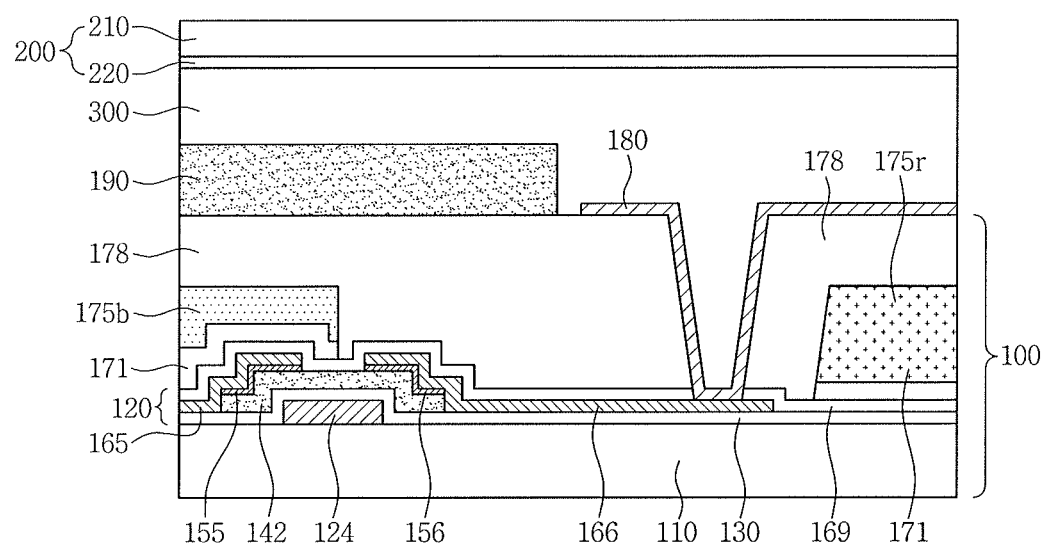
FIG. 8 illustrates a cross-sectional view of another example embodiment of a method of manufacturing a display device.

FIG. 8 illustrates a cross-sectional view of another example embodiment of a method of manufacturing the display device. A repetitive description of the method of manufacturing the display device which has been provided in the previous example embodiment will be omitted herein for convenience of description.

Referring to FIG. 8, in an example embodiment, the light blocking member 190 is disposed on the first substrate 110 on which the thin film transistor Q, the reflective layer 171, the color filter 175, the first insulating layer 178, and the pixel electrode 180 are disposed.

In the present example embodiment, respective patterns of the reflective layer 171 and the color filter 175 may be defined to overlap a portion of the thin film transistor Q or not to overlap the thin film transistor Q.

The light blocking member 190 may be disposed on the first insulating layer 178, and may overlap the thin film transistor Q. The light blocking member 190 may effectively prevent ambient light from being irradiated to the gate line 122 and the thin film transistor Q.

The light blocking member 190 may include a negative or positive photoresist, a black pigment, a black resin, or the like.

FIGS. 9A, 9B, 9C, 9D, 9E, and 9F illustrate cross-sectional views of another example embodiment of a method of manufacturing the display device. A repetitive description of the method of manufacturing the display device which has been provided in the previous example embodiment will be omitted herein for convenience of description.

Figure 9A:
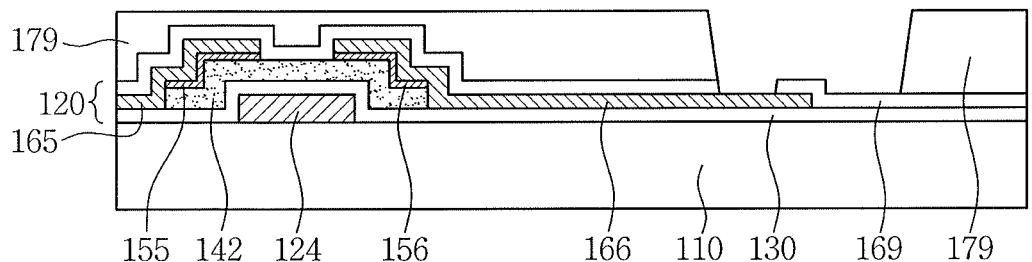
FIGS. 9A, 9B, 9C, 9D, 9E, and 9F illustrate cross-sectional views of another alternative example embodiment of a method of manufacturing a display device.

Referring to FIG. 9A, the second insulating layer 179 is disposed on the first substrate 110 on which the thin film transistor Q is disposed. In an example embodiment, the second insulating layer 179 may include silicon oxide or silicon nitride, for example.

The second contact hole through which the thin film transistor Q is exposed is defined through the second insulating layer 179.

Figure 9B:
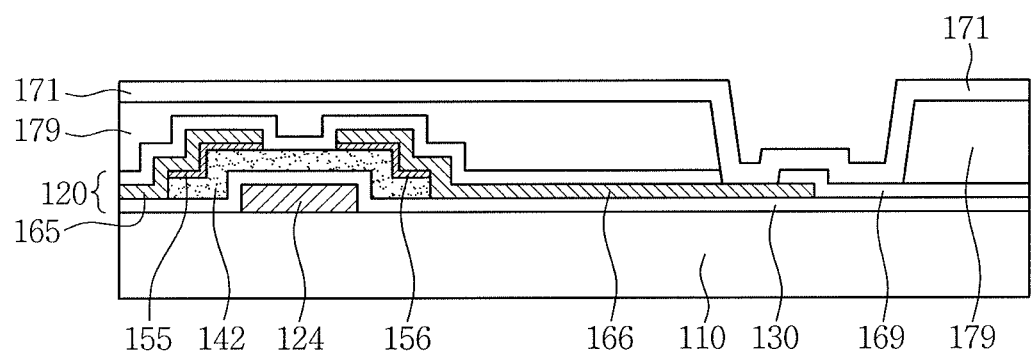

Referring to FIG. 9B, a reflective layer material 170 is disposed on the first substrate 110 on which the thin film transistor Q and the second insulating layer 179 are disposed. The reflective layer material 170 may include any suitable material that reflects an ambient light source, and may include a metal, for example.

Figure 9C:
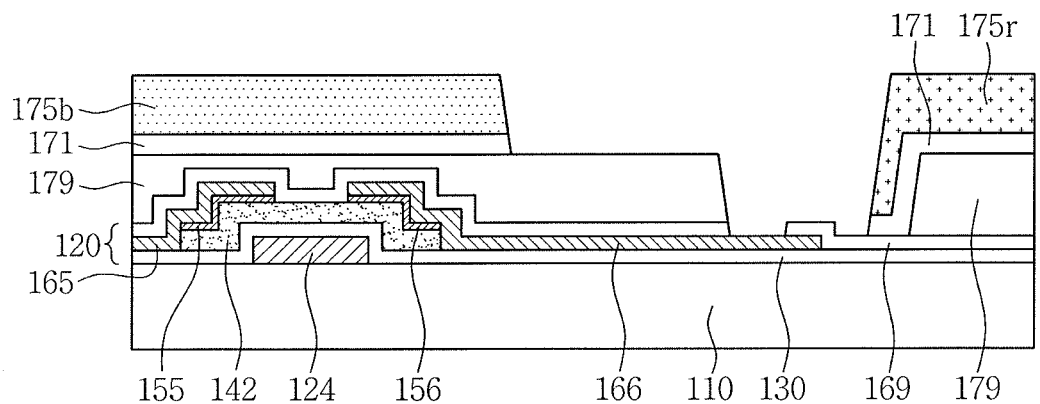

Referring to FIG. 9C, in an example embodiment, the red, green, and blue color filters 175r, 175g, and 175b are disposed on the reflective layer material 170 corresponding to the red, green, and blue pixel areas 102r, 102g, and 102b, respectively, thereby defining the respective patterns of the color filters 175 corresponding to respective ones of the pixel areas 102.

The color filter 175 including the red, green, and blue color filters 175r, 175g, and 175b may be provided by a photolithography process or an inkjet process, in addition to, or instead of, a coating process using a mask.

The color filter 175 may have a thickness in a range of about 2 μm to about 4 μm, but not being limited thereto.

In the present example embodiment, the pattern of the color filter 175 may be defined to overlap a portion of the thin film transistor Q or not to overlap the thin film transistor Q.

Figure 9D:
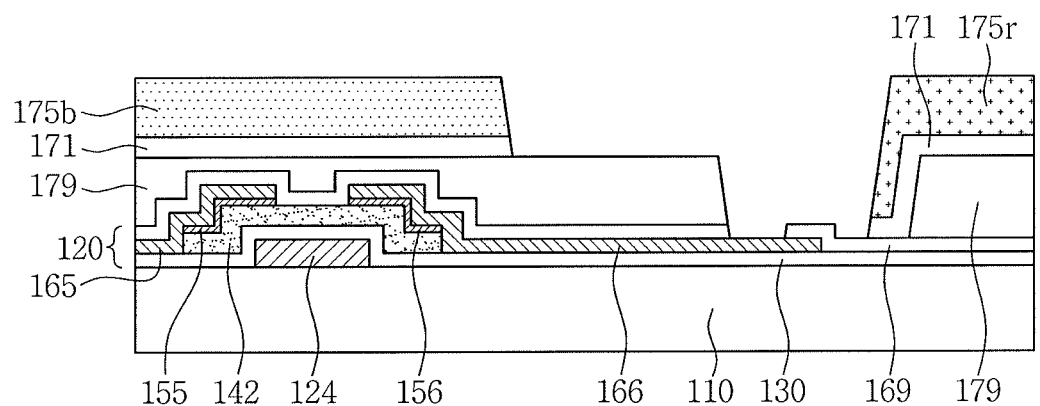

Referring to FIG. 9D, the reflective layer material 170 is patterned using the color filter 175 as a mask. In an example embodiment, the reflective layer material 170 is wet-etched on the first substrate 110, using an etchant including a $Fe^{3+}$ salt compound, nitric acid, acetic acid, a corrosion inhibitor, and water, or an etchant including nitric acid, phosphoric acid, acetic acid, an auxiliary oxide solubilizer, a fluorocarbon surfactant, and water. As a result, a portion of the reflective layer material 170 that is exposed externally of the color filter 175 is etched away and a portion of the reflective layer material 170 that is disposed below the color filter 175 remains, thereby defining the pattern of the reflective layer 171.

The pattern of the reflective layer 171 may be substantially the same as the pattern of the color filter 175.

The etching process may include, for example, wet etching process or a dry etching process.

In the present example embodiment, the number of masks used to define the pattern of the reflective layer 171 may be relatively reduced.

Figure 9E:
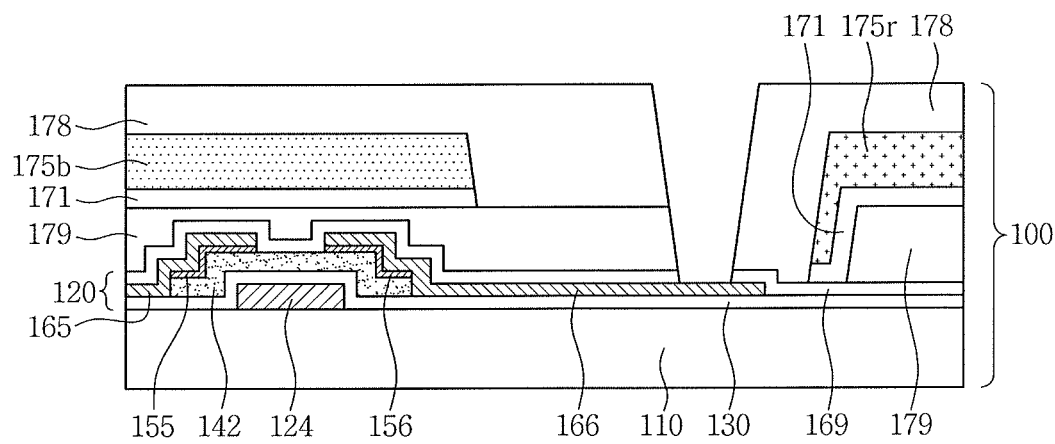

Referring to FIG. 9E, the first insulating layer 178 is disposed on the color filter 175. In an example embodiment, for example, the first insulating layer 178 may include silicon oxide or silicon nitride, and may have a thickness in a range of about 3,000 Å to about 3,500 Å. In the present example embodiment, the first contact hole through which the thin film transistor Q is exposed may be defined through the first insulating layer 178.

Figure 9F:
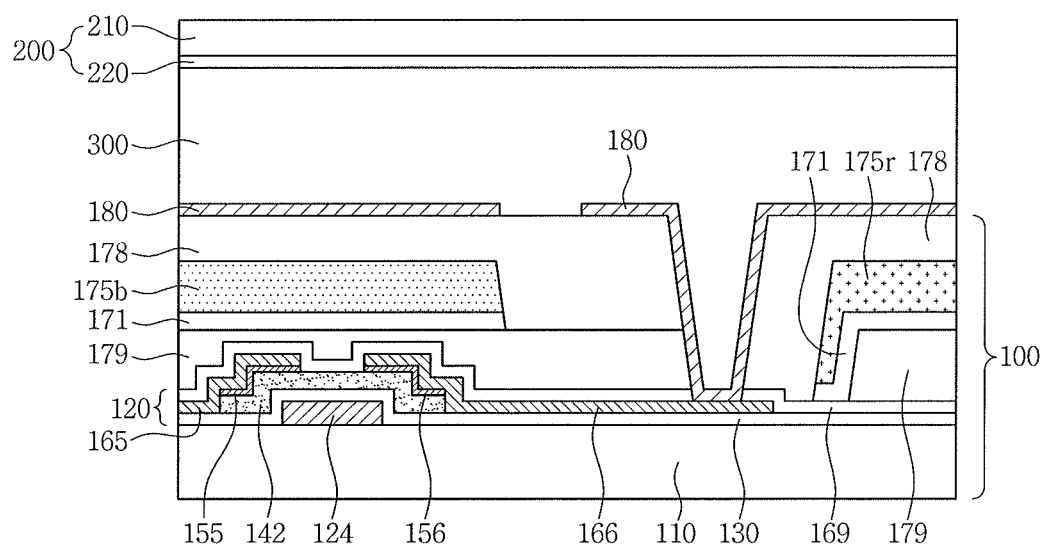

Referring to FIG. 9F, the pixel electrode 180 electrically connected to the thin film transistor Q, the liquid crystal layer 300, the common electrode 220, and the second substrate 210 are disposed on the first insulating layer 178.

By way of summation and review, an LCD device generally includes an LCD panel including two opposing display substrates including electrodes disposed thereon, and a liquid crystal layer interposed between the two display substrates. In general, the LCD device has a structure in which one of the two display substrates includes a plurality of thin film transistors and a pixel electrode disposed thereon, and the other display substrate includes a plurality of color filters, a light blocking member, and a common electrode disposed thereon. A color filter on array ("COA") structure in which a color filter, a light blocking member, a pixel electrode, and the like, are disposed on the same substrate, separately from a common electrode, has been considered to reduce or effectively prevent an alignment error between the pixel electrode and the color filter.

The LCD device may include a transmission-type LCD device (in which a backlight is disposed on a rear surface of an LCD panel so that light emitted from the backlight is incident on the LCD panel and an amount of light being transmitted through the LCD panel is adjusted based on the alignment of liquid crystal molecules to thereby display an image) and a reflection-type LCD device (in which natural ambient light or artificial ambient light is reflected on an LCD panel so that the transmittance of the light is adjusted based on the alignment of liquid crystal molecules to thereby display an image).

Among these, the reflection-type LCD device includes a reflective layer which reflects natural ambient light or artificial ambient light. The reflective layer is provided by depositing a metal on a substrate on which an organic layer is provided, and a portion of the metal is patterned using a reflective layer mask.

As described above, embodiments relate to a display device in which a color filter and a reflective layer have substantially the same pattern, and a method of manufacturing the display device. Embodiments may provide a method of manufacturing a display device in which a pattern of a reflective layer is defined using a color filter as a mask so as to simplify a mask process, and a display device.

In accordance with one or more of the aforementioned embodiments, an LCD device employs a color filter as a mask, rather than a typically used reflective layer mask, which may reduce manufacturing time and manufacturing costs of the LCD device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
  a first substrate;
  a thin film transistor on the first substrate;
  a passivation layer on the thin film transistor;
  a reflective layer on the passivation layer;
  a color filter on the reflective layer, the reflective layer having a substantially same contour as that of the color filter in a plan view;
  a first insulating layer on the color filter;
  a pixel electrode on the first insulating layer;
  a second substrate opposing the first substrate; and
  a liquid crystal layer between the first substrate and the second substrate,
  wherein the color filter and the reflective layer do not overlap the thin film transistor.

2. The display device as claimed in claim 1, further comprising a second insulating layer between the thin film transistor and the reflective layer.

3. The display device as claimed in claim 1, further comprising a light blocking member on the first insulating layer, the light blocking member overlapping the thin film transistor.

4. The display device as claimed in claim 1, wherein the reflective layer includes at least one of aluminum, an aluminum alloy, silver, and silver-molybdenum.

5. A method of manufacturing a display device, the method comprising:
  preparing a first substrate and a second substrate;
  disposing a thin film transistor on the first substrate;
  disposing a reflective layer material on the first substrate;
  disposing a color filter on the reflective layer material;
  patterning the reflective layer material using the color filter as a mask to thereby provide a reflective layer;
  disposing a first insulating layer on the color filter;
  disposing a pixel electrode on the first insulating layer; and
  disposing a liquid crystal layer between the first substrate and the second substrate,
  wherein the disposing of the color filter and the disposing of the reflective layer include defining a pattern of the color filter and defining a pattern of the reflective layer not to overlap the thin film transistor.

6. The method as claimed in claim 5, wherein the patterning of the reflective layer material includes wet etching.

7. The method as claimed in claim 5, further comprising disposing a light blocking member on the first insulating layer to overlap the thin film transistor.

8. The method as claimed in claim 5, further comprising disposing a second insulating layer between the thin film transistor and the reflective layer.

* * * * *